United States Patent [19]

Kelsall et al.

[11] Patent Number: 5,350,661
[45] Date of Patent: Sep. 27, 1994

[54] WATER-DEVELOPABLE PHOTOSENSITIVE PLATES ESPECIALLY SUITED FOR COMMERCIAL FLEXOGRAPHIC PRINTING

[75] Inventors: Robert W. Kelsall, San Diego; Allyson R. Maurer, Escondido, both of Calif.

[73] Assignee: Napp Systems, Inc., San Marcos, Calif.

[21] Appl. No.: 36,984

[22] Filed: Mar. 25, 1993

[51] Int. Cl.$^5$ ............................................. G03L 1/492
[52] U.S. Cl. ................................. 430/271; 430/275; 430/281; 430/286; 430/287; 430/288
[58] Field of Search ............... 430/271, 279, 281, 286, 430/288, 287

[56] References Cited

U.S. PATENT DOCUMENTS 4,927,738  5/1990  Iwanaga et al.
4,996,134  2/1991  Enyo et al.

FOREIGN PATENT DOCUMENTS

WO 88/02135  3/1988  PCT Int'l Appl.

Primary Examiner—Jack P. Brammer
Attorney, Agent, or Firm—Pretty, Schroeder, Brueggemann & Clark

[57] ABSTRACT

In accordance with the present invention, there are provided water-developable photopolymerizable compositions useful for the preparation of printing plates. Printing plates prepared employing invention compositions have excellent form stability, thereby enabling such plates to be handled without the need for excessive care. Once photopolymerized, printing plates of the invention have excellent physical properties, enabling their use in many very demanding commercial applications, e.g., commercial flexographic printing. Such applications require the photopolymerized resin to have excellent water resistance (so that exposure to water-based inks does not significantly alter resin properties), as well as high durability (so that the physical contacting associated with the printing process does not significantly degrade resin properties).

12 Claims, No Drawings

WATER-DEVELOPABLE PHOTOSENSITIVE PLATES ESPECIALLY SUITED FOR COMMERCIAL FLEXOGRAPHIC PRINTING

FIELD OF THE INVENTION

The present invention relates to water-developable photosensitive printing plates and compositions useful for the preparation thereof.

BACKGROUND OF THE INVENTION

Photosensitive resin plates for the manufacture of relief printing plates are preferably developable with water rather than organic solvent for various reasons such as ease of handling, health of workers who are in contact therewith, safety, and avoidance of environmental pollution. It is also very desirable to be able to use water based inks for printing with relief printing plates prepared from photosensitive resins, because oil based inks tend to mist and hence to cause health problems. In addition, the use of water based inks is favored in that the resulting print will not show through the printed paper from one side to the other and does not tend to rub off on the fingers.

There are various known photosensitive resin plates. The photosensitive resin compositions employed for conventional photosensitive resin plates are based on liquid unsaturated polyesters, polyvinyl alcohols, water soluble polyamides, cellulose acetate succinates, alcohol soluble polyamides, etc. All these materials, however, suffer from significant disadvantages. For instance, liquid unsaturated polyesters are inconvenient to handle and necessitate the use of an alkaline solution or a special air knife for developing. Polyvinyl alcohols and water soluble polyamides have extremely low resistance to water, and consequently water based inks are not usable with such resins. Cellulose acetate succinates require the use of an alkaline solution for development, and alcohol soluble polyamides require the use of an inflammable alcohol.

U.S. Pat. No. 3,801,328 (issued Apr. 2, 1974) discloses a water developable, photopolymerizable composition for preparation of a photosensitive resin plate. The disclosed composition comprises unsaturated ethylenic monomers, a photopolymerization initiator and a partially saponified polyvinyl acetate. This composition has been found to be developed very satisfactorily with water to give a relief printing plate. However, the water resistance of this relief printing plate at the surface is low, which in turn precludes its use with a water based ink.

Numerous other water developable, photopolymerizable compositions have been developed for the preparation of photosensitive resin plates. Each suffers from certain drawbacks, e.g., lack of sufficient water resistance to be useful with water based inks, lack of sufficient structural integrity to withstand the physical rigors of commercial printing operations, etc. Accordingly, what is still needed in the art are resins having improved chemical and physical properties.

BRIEF DESCRIPTION OF THE INVENTION

In accordance with the present invention, we have developed novel water-developable photopolymerizable compositions useful for the preparation of printing plates. Printing plates prepared employing invention compositions have excellent form stability, thereby enabling such plates to be handled without the need for excessive care. Once photopolymerized, printing plates of the invention have excellent physical properties, enabling their use in many very demanding commercial applications, e.g., commercial flexographic printing. Such applications require the photopolymerized resin to have excellent water resistance (so that exposure to water-based inks does not significantly alter resin properties), as well as high resilience (so that the physical contacting associated with the printing process does not significantly degrade resin properties). Photopolymerized resin of the invention maintains a good balance among tensile strength, % elongation, and Young's modulus to 30%. Photopolymerization of invention resin yields a product with ink transfer characteristics considered acceptable by flexographic printing standards and demonstrates sufficient toughness for extended printing runs as required in such areas as telephone directory and comic section printing.

DETAILED DESCRIPTION OF THE INVENTION

In accordance with the present invention, there are provided water-developable photosensitive resin compositions having a thickness increase, after photopolymerization and development thereof, upon immersion in water for 24 hours at ambient conditions, of less than about 3%, and hardness, as measured by the Shore A test, of less than about 75, said composition comprising:

(A) in the range of about 30 up to 90 wt % of a copolymer comprising in the range of:
 (i) 5 up to 95 mol % of an aliphatic conjugated diene monomer,
 (ii) 1 up to 30 mol % of an $\alpha,\beta$-ethylenically unsaturated carboxylic acid,
 (iii) 0.1 up to 10 mol % of a polyfunctional vinyl monomer, and
 (iv) 0 up to 70 mol % of a monofuncticnal vinyl monomer;

(B) in the range of about 0.2 up to 2 mol of a basic nitrogen-containing compound per mol of carboxyl groups in copolymer (A), (C) in the range of about 5 up to 70 wt % of at least one ethylenically unsaturated monomer having an acrylate core structure, i.e.,:

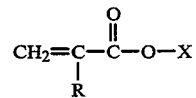

wherein R is H or methyl, and X is selected from:
(a) an alkyl group having in the range of about 8 up to 15 carbon atoms,
(b)

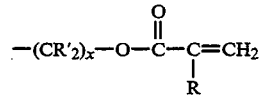

wherein each R' is independently selected from H or methyl, R is as defined above, selected independently of R of the core structure, and x is an integer falling in the range of about 2 up to 6,
(c)

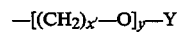

wherein x' is an integer falling in the range of about 1 up to 12, y is an integer falling in the range of about 4 up to 12, and Y is selected from: alkyl having in the range of about 3 up to 15 carbon atoms such that two or more of the core species can be linked to one another, or

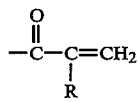

wherein R is as defined above and is selected independently of R of the core structure, and
(d)

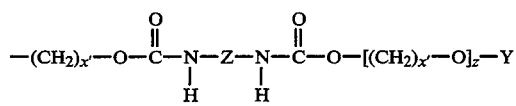

wherein x' and Y are as defined above, Z is an aliphatic, aromatic, aliphatic-substituted aromatic, or aromatic-substituted aliphatic linker having a molecular weight in the range of about 4,000–5,000, and z is an integer which falls in the range of about 0 up to 10, and (D) in the range of about 0.01 up to 10 wt % of at least one photopolymerization initiator.

Optionally, invention compositions further comprise in the range of about 0.5 up to 10 wt % polybutadiene.

Invention compositions, after photopolymerization and development thereof, have excellent water resistance. Water resistance can be measured in a variety of ways, such as, for example, by the percent thickness increase, which, after about 2 hours immersion in water at ambient conditions, is less than about 1%, and less than about 3% after 24 hours exposure to such conditions. Invention compositions also possess excellent physical properties, e.g., hardness, as measured by the Shore A test, of less than about 75 after photopolymerization and development thereof. In addition, invention compositions possess excellent tensile properties, e.g., a tensile strength of >190 g/mm$^2$ (as measured by the Instron Series IX analyzer), an elongation of >55%, and a Young's modulus to 30% of <700 g/mm$^2$. Further, invention compositions demonstrate superior highlight dot toughness (as measured by the Heidon method, described in Example 6).

Copolymers contemplated for use in the practice of the present invention are prepared from a combination of several components, e.g., an aliphatic conjugated diene monomer, an $\alpha,\beta$-ethylenically unsaturated carboxylic acid, a polyfunctional vinyl monomer, and optionally a monofunctional vinyl monomer. Typically, such compositions comprise in the range of about:

(i) 5 up to 95 mol % of an aliphatic conjugated diene monomer, (ii) 1 up to 30 mol % of an $\alpha,\beta$-ethylenically unsaturated carboxylic acid, (iii) 0.1 up to 10 mol % of a polyfunctional vinyl monomer, and (iv) 0 up to 70 mol % of a monofunctional vinyl monomer.

Preferred copolymer compositions employed in the practice of the present invention comprise in the range of:

(i) 40 up to 85 mol % of an aliphatic conjugated diene monomer, (ii) 2.5 up to 15 mol % of an $\alpha,\beta$-ethylenically unsaturated carboxylic acid, (iii) 0.5 up to 5 mol % of a polyfunctional vinyl monomer, and (iv) 5 up to 30 mol % of a monofunctional vinyl monomer.

Aliphatic conjugated diene monomers contemplated for use in the practice of the present invention include butadiene, isoprene, chloroprene, dimethylbutadiene and the like.

$\alpha,\beta$-ethylenically unsaturated carboxylic acids contemplated for use in the practice of the present invention include methacrylic acid, acrylic acid, itaconic acid, maleic acid, and the like.

Polyfunctional vinyl monomers contemplated for use in the practice of the present invention include ethyleneglycol dimethacrylate, divinyl benzene, 1,6-hexanediol diacrylate, 1,4-butanediol diacrylate, and the like.

Monofunctional vinyl monomers contemplated for use in the practice of the present invention include ethyl acrylate, methyl acrylate, hydroxyethyl methacrylate, methyl methacrylate, $\beta$-carboxyethyl acrylate, and the like, as well as mixtures of any two or more thereof.

Basic nitrogen-containing compounds contemplated for use in the practice of the present invention include dimethylaminopropyl methacrylamide (DMAPMA), N-dialkylaminoalkyl (meth)acrylamide, alkylamino (meth)acrylamide, N-vinyl pyrrolidone, and the like.

Ethylenically unsaturated monomers having an acrylate core structure contemplated for use in the practice of the present invention include 1,4-butanediol dimethacrylate, lauryl methacrylate, polyethylene glycol (400) dimethacrylate, highly ethoxylated trimethylol propane triacrylate, propoxylated neopentyl glycol diacrylate, ethyoxylated neopentylglycol di(meth)acrylate, polyethylene glycol (600) di(meth)acrylate, isobornyl acrylate, 1,6-hexanediol di(meth)acrylate, ethoxylated bisphenol A di(meth)acrylate, cyclohexyl(meth)acrylate, diethylene glycol di(meth)acrylate, glycerol di(meth)acrylate, aliphatic urethane di(meth)acrylate, and the like. Presently preferred ethylenically unsaturated monomers contemplated for use in the practice of the present invention include 1,4-butanediol dimethacrylate, lauryl methacrylate, polyethylene glycol (400) dimethacrylate, highly ethoxylated trimethylol propane triacrylate, aliphatic urethane diacrylate, and the like.

Those of skill in the art recognize that a wide range of photopolymerization initiators can be used in the practice of the present invention. The initiator (A) used in the composition of the invention includes ordinary photoreaction initiators such as $\alpha$-diketone compounds (e.g., diacetyl, benzil, and the like), acyloins (e.g., benzoin, pivaloin, and the like), acyloin ethers (e.g., benzoin methyl ether, benzoin ethyl ether, benzoin propyl ether, and the like), polynuclear quinones (anthraquinone, 1,4-naphthoquinone), acyl phosphine oxides, and the like. The initiator (D) is typically added in an amount of 0.01 to 10 parts by weight, preferably 0.5 to 5 parts by weight, per 100 parts by weight of the copolymer (A). Presently preferred initiators include benzyl dimethyl ketal, 2-ethyl anthraquinone, or mixtures thereof.

Polybutadienes contemplated for use in the practice of the present invention include 1,2-polybutadiene (cis-, trans-, or mixtures thereof), 1,4-polybutadiene (cis-, trans-, or mixtures thereof), maleic anhydride adducts of polybutadiene, which may then be modified via standard ring-opening techniques and subsequent (half) esterification or (half) amidation, and the like. Presently preferred polybutadiene used in the practice of the present invention is cis-1,2-polybutadiene.

Invention composition may also contain a plasticizer, which acts to reduce the glass transition temperature of the polymer, thereby easing processibility of the composition. Examples of plasticizers useful in the practice of the present invention include glycerin, ethoxylated phenols, ethoxylated glycerin, and the like.

Invention composition may further contain additives to improve processability and handling characteristics. Such additives include, for example, polyethylene waxes, paraffins, esters of stearic acid (such as sorbitol monostearate), ethylene-acrylic acid copolymers, polyhydroxy styrene, and the like.

If desired, for example, to increase storage stability of the invention compositions, there may further be added a storage stabilizer such as hydroxyaromatic compounds (e.g., hydroquinone, p-methoxyphenol, p-t-butylcatechol, 2,6-di-t-butyl-p-cresol, pyrogallol, and the like); quinones (e.g., benzoquinone, p-toluquinone, p-xyloquinone, and the like); amines (e.g., N-phenyl-$\alpha$-naphthylamine, and the like); imidazoles (e.g., methylbenzimidazole); and the like, in an amount of 0.01 to 2 parts by weight per 100 parts by weight of copolymer (A).

Presently preferred compositions of the invention comprise, in addition to the above-described copolymer:

(B) in the range of about 5 up to 7 parts of said basic nitrogen-containing compound per 100 parts of said copolymer, (C) in the range of about 20 up to 30 parts of said ethylenically unsaturated monomer per 100 parts of said copolymer, (D) the range of about 0.5 up to 2.5 parts photopolymerization initiator per 100 parts of said copolymer, and (E) in the range of about 1 up to 3 parts polybutadiene per 100 parts of said copolymer.

One of the desirable characteristics of invention compositions is their developability with water of substantially neutral pH. Thus, there is no need to use pH modified (i.e., acidic or basic) media when developing invention compositions.

Photosensitive compositions of the invention require only a short time for light exposure because of their high photosensitivity. Invention compositions can be developed in 1 to 2 minutes with water. Photoset and developed compositions can be used for printing immediately after drying, and hence, invention composition can substantially improve the conventional complicated process and the time for producing rubber relief plates for flexographic printing.

Solvent type flexographic ink can be used in flexographic printing using a rubber relief plate made from invention composition. In addition, since invention composition, once photocured, has excellent water resistance (in spite of the high water solubility of uncured invention composition), aqueous flexographic ink can also be used therewith (consistent with the gradual shift in the printing field from solvent type flexographic inks to aqueous type flexographic inks). This shift is driven, in large part, by the desire to reduce the contribution to air and water pollution made by the printing industry.

Invention compositions not only provide resin relief plates for flexographic printing, but can also be widely utilized as a photosensitive material in various applications such as the production of relief plates for newspaper printing and ordinary commercial printing, name plates, printed circuit boards, displays and photoadhesives. Besides, photosensitive compositions of the invention can be used as photopolymerizable coatings.

In accordance with another embodiment of the present invention, there are provided water-developable photosensitive resin plates having excellent form stability, as indicated by undergoing substantially no change in thickness uniformity when subjected to temperature in the range of 25° C. and 40° C., wherein said plate, after photopolymerization and development thereof, has a thickness increase, upon immersion in water for 24 hours at ambient conditions, of less than about 3%, and hardness, as measured by the Shore A test, of less than about 75, said plate comprising a support having deposited thereon a layer of the above-described photosensitive resin composition.

Supports contemplated for use in the practice of the present invention can be prepared of a variety of materials, e.g., metal, plastic, paper, wood, glass, and the like. Exemplary support materials include steel, aluminum and plastic (e.g., polyethylene terephthalate).

In accordance with yet another embodiment of the present invention, there are provided relief printing plates having a thickness increase, upon 24 hours immersion in water at ambient conditions, of less than about 3%, and hardness, as measured by the Shore A test, of less than about 75, said plate comprising a support having deposited thereon a photopolymerized layer of the above-described photosensitive resin composition.

In accordance with still another embodiment of the present invention, there is provided a method for preparing water-developable photosensitive resin plates suitable for the manufacture of relief printing plates having excellent form stability, as indicated by undergoing substantially no change in thickness uniformity when subjected to temperature in the range of 25° C. and 40° C., wherein said plate has a thickness increase, after photopolymerization and development thereof, upon immersion in water for 24 hours at ambient conditions, of less than about 3%, and hardness, as measured by the Shore A test, of less than about 75, said method comprising depositing onto a suitable support a substantially homogenous, solvent-free combination of components (A), (B), (C), (D) and optionally (E), as described above.

"Depositing" of the above-described compositions onto support can be carried out in a variety of ways, e.g., by extrusion, roll coating, heat processing, solvent casting, and the like. These techniques can be readily carried out by those of skill in the art.

In accordance with a further embodiment of the present invention, there is provided a method for preparing relief printing plates having a thickness increase, after photopolymerization and development thereof, upon 24 hours immersion in water at ambient conditions, of less than about 3%, and hardness, as measured by the Shore A test, of less than about 75, said method comprising:

exposing a photosensitive resign plate according to the invention (as described above), through a negative film having an image thereon, to electromagnetic radiation of sufficient energy to promote the polymerization of said resin, and washing said plate with a sufficient quantity of water to remove the photosensitive resin composition from the non-exposed portions of said plate.

The invention will now be described in greater detail by reference to the following non-limiting examples.

EXAMPLE 1

Fifty seven (57) parts of a copolymer composition comprising:
- (i) 70 mol % of an aliphatic conjugated diene monomer (butadiene),
- (ii) 9 mol % of an $\alpha,\beta$-ethylenically unsaturated carboxylic acid (methacrylic acid),
- (iii) 2 mol % of a polyfunctional vinyl monomer (divinyl benzene),
- (iv) 19 mol % of a monofunctional vinyl monomer (methyl methacrylate);

were mixed with about 2 wt % sorbitol monostearate in a pressure kneader-type mixer with a heating jacket. To the mixture was added 5.7 parts dimethylaminopropyl methacrylamide, 4 parts 1,4-butanediol dimethacrylate, 11.6 parts lauryl methacrylate, 5.4 parts ethoxylated trimethylolpropane triacrylate, 3.6 parts of an aliphatic urethane acrylate/propoxylated neopentyl glycol blend (product no. CN966I80, Sartomer, Exton, Pa.), 1.9 parts liquid polybutadiene (Ricon 142, Ricon Resins, Inc., Grand Junction, CO.), 5.4 parts phenyl glycol ether, 1.9 parts 2,2-dimethoxy-2-phenyl acetophenone, and 0.5 parts 2,6-di-t-butyl cresol. The components were mixed for one hour.

The resin composition was extruded to a thickness of 15 mils (1 mil=0.001 inch) onto a coated steel support. The resulting film was exposed to ultraviolet light provided by a medium pressure mercury vapor lamp for approximately 5.0 integrated units (IU) of exposure at low intensity and 50 IU at high intensity through a negative film. The irradiated plate was then washed with water heated to 138° F. and softened to <5 ppm $CaCO_3$. An airknife was used to remove excess water, and the plate postcured with mercury vapor lamps. The washout and postcure process took approximately four and one-half minutes. A flexographic printing plate was the result. The Shore A hardness of the photocured polymeric film was 75. In addition, the plate exhibited excellent tensile strength and elongation properties, as summarized in the Table below.

EXAMPLE 2

A resin composition was prepared as described in Example 1, except for the use of 1.55 parts of 2,2-dimethoxy-2-phenyl acetophenone (instead of 1.9 parts as employed in Example 1). The resin was deposited at a thickness of 15 mils on a coated polyethylene terephthalate film using a heat press and forms. The film was imaged and developed as described in Example 1 to form a flexographic printing plate. The Shore A hardness of the film was 72. Additional physical properties of the resulting plate are summarized in the Table below.

EXAMPLE 3

A resin composition was prepared as described in Example 1, except 0.39 parts of 2-ethylanthraquinone and 0.44 parts 2,2-dimethoxy-2-phenyl acetophenone were used as the photoinitiator system (instead of 1.9 parts 2,2-dimethoxy-2-phenyl acetophenone alone). The resin was molded onto a coated steel support to a thickness of 15 mils using heated rollers. The film was imaged and processed as described in Example 1 to form a flexographic printing plate. The Shore A hardness of the film was 63. The plate demonstrated excellent image quality and processibility. Resilience, as measured by resilometer (see Example 6 for description of how this measurement is carried out), was 36. Additional physical properties of the resulting plate are summarized in the Table below.

EXAMPLE 4

A resin composition was prepared as described in Example 1, except 0.05% 2-ethyl anthraquinone and 0.05% 2,2-dimethoxy-2-phenyl acetophenone were used as the photoinitiator system (instead of 1.9 parts 2,2-dimethoxy-2-phenyl acetophenone alone). The resin was molded onto a coated steel support to a thickness of 15 mils using heated rollers, and was imaged and developed as described in Example 1. The Shore A hardness of the film was 71. Additional physical properties of the resulting plate are summarized in the Table below.

EXAMPLE 5

A resin composition was prepared as described in Example 1, however, 1.5 parts of the 1,4-butanediol dimethacrylate were replaced with PEG (400) dimethacrylate. Thus, a mixture of 2.5 parts 1,4-butanediol dimethacrylate and 1.5 parts PEG (400) dimethacrylate were employed. The resin was molded onto a coated steel support as in Example 4, and was exposed and processed as in Example 1. The Shore A hardness of the film was 75. The plate demonstrated a high level of toughness, good image quality, and excellent processability, as summarized in the Table below.

Physical properties of the plates prepared as described in each of the preceding examples, as well as this example, are summarized in the following Table.

TABLE

| PLATE DATA | Range of Response | Example 1 | Example 2 | Example 3 | Example 4 | Example 5 |
|---|---|---|---|---|---|---|
| Shore A hardness[a] | ≦76 | 76 | 72 | 63 | 71 | 75 |
| Highlight Dot Toughness @ 100 g/200 g[a] | ≦15/30 | 10/15 | 13/21 | 15/28 | 28/31 | 12/33 |
| % Elongation[b] | ≧55 | 66 | 65 | 57 | 63 | 69 |
| Tensile strength (g/mm$^2$) | >400 | 390 | 309 | 197 | 242 | 328 |
| Young's modulus (g/mm$^2$ to 30%)[b] | <700 | 635 | 523 | 374 | 430 | 512 |
| Bounce (%)[c] | ≧25 | 27 | 25 | 36 | 26 | 27 |
| Water resistance: % thickness increase (2 hrs/24 hrs) | <1.0/<3.0 | 0.81/2.6 | d | d | d | d |
| Duration on press with | >1,000,000 | 650,000 | d | d | d | d |

TABLE-continued

| PLATE DATA | Range of Response | Example 1 | Example 2 | Example 3 | Example 4 | Example 5 |
|---|---|---|---|---|---|---|
| acceptable print quality | | | | | | |
| Process solvent | | Soft Water | Soft Water | Soft Water | Soft Water | Soft Water | Soft Water |

[a] See Example 6 for details as to how these values are obtained
[b] Commercial Flexo Method
(see Example 6 for details as to how this is carried out)
[c] Determined by the Resilience test method (see Example 6)
d ND = not determined The data in the preceding table demonstrate that invention compositions combine the properties of low Shore A hardness, good tensile properties, high water resistance, and excellent durability.

EXAMPLE 6

Test Methods

A. Heidon highlight dot toughness test

1. Machine Preparation

All that is needed for this test is the mechanical part of a Heidon 14 Peeling/Slipping/Scratching Tester (Shinto Scientific Co., Ltd., Tokyo, Japan) with the motor-driven sled and balanced arm. Align and fasten the attachment with the teflon stylus to the metal rod. Screw in the weight saucer at the top of the attachment.

2. Test Procedure

Cut a 3 inch×7 inch plate sample and expose it using a suitable source of irradiation (e.g., a Consolux exposure unit (available from Burgess Corporation, Plymouth, Minn.) and a "Dot Toughness Negative" (i.e., a negative with two ⅝ inch by 3-⅞ inch halftone strips containing highlight dots ranging consecutively from 3% to 50%).

Process the exposed plate in an FP-2 processor (NAPP SYSTEMS INC., San Marcos, Calif.) at 31 inches per minute; do not allow the plate to "drop out". Instead, grasp the exiting plate and guide it out at the speed of the processor. As soon as the plate is removed from the processor, begin timing for a period of 10 minutes. Clamp the plate to the sled of the Heiden tester and place a weight on the opposite end of the plate. The plate must lie absolutely flat against the sled for the measurement to be accurate.

After the ten minute period has expired, lower the arm until the stylus rests on the plate surface. The starting position should be at the top of the 50% dot area imaged on the plate. Place the 200 g weight in the saucer and flip the toggle switch to "measure", which starts the sled moving.

After the sled stops moving, remove the weight, lift up and secure the arm. Now flip the toggle switch to "reverse", to return the sled to its original position. Adjust the plate position so that a fresh area of dots can be tested. Repeat twice using the 200 g weight.

After three trials using the 200 g weight are completed, turn the plate around so that the halftone strip opposite the one already tested is under the stylus. Repeat the above test on this strip using the 100 g weight.

3. Evaluating the Results

Examine the test plate. Observe the % dot markings along the different highlight areas. Observe also the scoring left by the stylus on the plate surface. This scoring represents broken highlight dots. The % dot at which the scoring commences is the score of the plate and is reported as a percent value. Two scores, one for the 200 g weight load and one of the 100 g weight load, are generally reported for each plate.

B. Resilience Test Method-Shore SR1 Resilometer

Cut cured resin into four equal pieces (2.5 cm×2.5 cm) and stack them; stack height should be 12 mm±0.5 mm. Place the stack of resin under the resilometer (Shore SR1 Resilometer, Shore Instrument and Manufacturing Co., Jamaica, N.Y.) and drop the plunger six times. Report the average bounce height of the last three drops. A smooth release of the plunger produces the most reproducible results.

C. Hardness Test Method

Place 150 grams of raw resin between two sheets of silicone-coated mylar and position the resulting sandwich in the center of the molding press. Apply 150 tons of force @70° C. for 5 seconds. Cut out six to eight 4 inch×4 inch squares of the resulting pressed, raw resin and stack. The weight of the stack should be 75 to 80 grams.

Place the resin stack in the center of a square steel frame mold with internal dimensions of 6 inch×6 inch×3 mm thick. Place the resin stack and steel frame between 2 sheets of silicone-coated mylar and position the resulting assemblage in the center of the molding press. Apply 100 tons of force @70° C. for 20 seconds. Repeat until there is enough bubble-free resin to cut out two 5 cm×5 cm squares.

Expose the molded resin for 5 minutes to a medium pressure mercury vapor lamp, mounted in a Newsprinter II exposure unit (NAPP SYSTEMS INC., San Marcos, Calif.) while still in the mold. Turn the square over and expose the other side for an additional 5 minutes.

Trim approximately ½ inch of cured resin from each side of the 6 inch×6 inch square. Cut out and stack two 5 cm×5 cm squares with a thickness tolerance of ±50 microns. Place the resin stack in a constant temperature room at a temperature of 25° C. for 2 hours before making any measurements.

Adjust the Shore automatic operating stand so that the bottom of the durometer (not the indenter) is approximately ¼ inch from the specimen. Use this procedure for calibrating the durometer with standards and for making specimen measurements. Turn on the automatic operating stand and make five measurements, ½ inch from the edge at each corner and in the center. Turn the stack over and make five more measurements. The average and standard deviation of the ten measurements is then reported.

D. Commercial Flexo Method #2

For testing commercial flexo resin, Commercial Flexo Method #2 is used with a 100 Kg (1 KN) load cell on an Instron Strain Gauge Extensometer Model 4202 (Instron Corporation, Canton, Mass.). Instrument parameters employed include:

| Sample width | 10 mm, |
| --- | --- |
| Gauge length | 49.9999 mm, |
| Grip distance | 69.9999 mm, and |
| Cross head speed | 75.0011 mm/min. |

A dumbbell sample (~1.4 mm thick, fully cured resin) is inserted between clamps (positioned about 70 mm apart) and tightened well. It is desirable for the sample to be as straight as possible, with as little slack as possible.

Enter the mean thickness for the sample, and start the instrument. Repeat for each sample (about 8-10 samples should be tested to obtain good statistical results). The instrument's computer will calculate mean values for tensile strength, % elongation, and Young's modulus to 30%.

While the invention has been described in detail with reference to certain preferred embodiments thereof, it will be understood that modifications and variations are within the spirit and scope of that which is described and claimed.

That which is claimed is:

1. A water-developable photosensitive resin composition having a thickness increase, after photopolymerization and development thereof, upon immersion in water for 24 hours at ambient conditions, of less than about 3%, and hardness, as measured by the Shore A test, of less than about 75, said composition comprising:

(A) in the range of about 30 up to 90 wt % of a copolymer comprising in the range of:

(i) 5 up to 95 mol % of an aliphatic conjugated diene monomer, (ii) 1 up to 30 mol % of an $\alpha,\beta$-ethylenically unsaturated carboxylic acid, (iii) 0.1 up to 10 mol % of a polyfunctional vinyl monomer, and (iv) 0 up to 70 mol % of a monofunctional vinyl monomer;

(B) in the range of about 0.2 up to 2 mol of a basic nitrogen-containing compound per mol of carboxyl groups in copolymer (A), (C) in the range of about 5 up to 70 wt % of a mixture of ethylenically unsaturated monomers, wherein said mixture contains at least one ethylenically unsaturated monomer selected from each of (a), (b), (c) and (d) below, wherein each of (a), (b), (c) and (d) have the core structure:

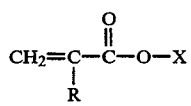

wherein R is H or methyl, and X is selected from:
(a) an alkyl group having in the range of about 8 up to 15 carbon atoms,
(b)

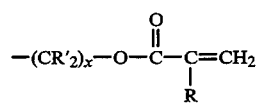

wherein each R' is independently selected from H or methyl, R is as defined above, selected independently of R of the core structure, and x is an integer falling in the range of about 2 up to 6, (c)

$$-[(CH_2)_{x'}-O]_y-Y$$

wherein x' is an integer falling in the range of about 1 up to 12, y is an integer falling in the range of about 4 up to 12, and Y is selected from:
alkyl having in the range of about 3 up to 15 carbon atoms such that two or more of the core species can be linked to one another, or

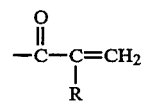

wherein R is as defined above and is selected independently of R of the core structure, and (d)

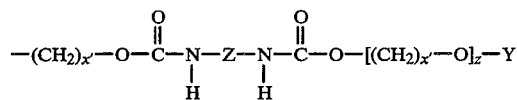

wherein x' and Y are as defined above, Z is an aliphatic, aromatic, aliphatic-substituted aromatic, or aromatic-substituted aliphatic linker having a molecular weight in the range of about 4,000–5,000, and z is an integer which falls in the range of about 0 up to 10, and (D) in the range of about 0.01 up to 10 wt % of at least one photopolymerization initiator.

2. A composition according to claim 1 further comprising in the range of about 0.5 up to 10 wt % polybutadiene.

3. A composition according to claim 2 comprising, in addition to said copolymer:

(B) in the range of about 5 up to 7 parts of said basic nitrogen-containing compound per 100 parts of said copolymer, (C) in the range of about 20 up to 30 parts of said mixture of ethylenically unsaturated monomers per 100 parts of said copolymer, (D) in the range of about 0.5 up to 2.5 parts photopolymerization initiator per 100 parts of said copolymer, and (E) in the range of about 1 up to 3 parts polybutadiene per 100 parts of said copolymer.

4. A composition according to claim 3 wherein said aliphatic conjugated diene monomer is butadiene or isoprene, said $\alpha,\beta$-ethylenically unsaturated carboxylic acid is methacrylic acid, said polyfunctional vinyl monomer is ethyleneglycol dimethacrylate, divinyl benzene, or 1,6-hexanediol diacrylate, said monofunctional vinyl monomer is selected from ethyl acrylate or methyl acrylate, as well as mixtures of any two or more thereof, and said polybutadiene is 1,2-polybutadiene.

5. A composition according to claim 1 wherein said copolymer comprises in the range of:

(i) 40 up to 85 mol % of an aliphatic conjugated diene monomer, (ii) 2.5 up to 15 mol % of an $\alpha,\beta$-ethylenically unsaturated carboxylic acid, (iii) 0.5 up to 5 mol % of a polyfunctional vinyl monomer, and (iv) 5 up to 30 mol % of a monofunctional vinyl monomer.

6. A composition according to claim 5 wherein said aliphatic conjugated diene monomer is butadiene or isoprene, said α,β-ethylenically unsaturated carboxylic acid is methacrylic acid, said polyfunctional vinyl monomer is ethyleneglycol dimethacrylate, divinyl benzene, or 1,6-hexanediol diacrylate, and said monofunctional vinyl monomer is selected from ethyl acrylate or methyl acrylate, as well as mixtures of any two or more thereof.

7. A composition according to claim 1 wherein said basic nitrogen-containing compound is dimethylaminopropyl methacrylamide (DMAPMA).

8. A composition according to claim 1 wherein said mixture of ethylenically unsaturated monomers (C) comprises:
   (a) 1,4-butanediol dimethacrylate (MBS),
   (b) lauryl methacrylate (MLS),
   (c) polyethylene glycol (400) dimethacrylate (MES), highly ethoxylated trimethylol propane triacrylate (MTH), propoxylated neopentyl glycol diacrylate, or combinations of any two or more thereof, and
   (d) aliphatic urethane acrylate.

9. A composition according to claim 1 wherein said photopolymerization initiator is selected from benzyl dimethyl ketal, 2-ethyl anthraquinone, or mixtures thereof.

10. A water-developable photosensitive resin plate having excellent form stability, wherein said plate undergoes substantially no change in thickness uniformity when subjected to temperature in the range of 25° C. and 40° C., wherein said plate, after photopolymerization and development thereof, has a thickness increase, after immersion in water for 24 hours at ambient conditions, of less than about 3%, and hardness, as measured by the Shore A test, of less than about 75, said plate comprising a support having deposited thereon a layer of photosensitive resin composition according to claim 1.

11. A plate according to claim 10 wherein said support is selected from metal or plastic material.

12. A relief printing plate having a thickness increase, after 24 hours immersion in water at ambient conditions, of less than about 3%, and hardness, as measured by the Shore A test, of less than about 75, said plate comprising a support having deposited thereon a photopolymerized layer of photosensitive resin composition according to claim 1.

* * * * *